(12) United States Patent
Tilke et al.

(10) Patent No.: US 8,936,995 B2
(45) Date of Patent: Jan. 20, 2015

(54) METHODS OF FABRICATING ISOLATION REGIONS OF SEMICONDUCTOR DEVICES AND STRUCTURES THEREOF

(75) Inventors: Armin Tilke, Beacon, NY (US); Marcus Culmsee, Wappingers Falls, NY (US); Chris Stapelmann, Tervuren (BE); Bee Kim Hong, Dresden (DE); Roland Hampp, Poughkeepsie, NY (US)

(73) Assignee: Infineon Technologies AG, Neubiberg (DE)

( * ) Notice: Subject to any disclaimer, the term of this patent is extended or adjusted under 35 U.S.C. 154(b) by 125 days.

(21) Appl. No.: 11/365,226

(22) Filed: Mar. 1, 2006

(65) Prior Publication Data

US 2007/0205489 A1 Sep. 6, 2007

(51) Int. Cl.
*H01L 21/762* (2006.01)
*H01L 21/77* (2006.01)

(52) U.S. Cl.
CPC .... *H01L 21/76229* (2013.01); *H01L 21/76232* (2013.01)
USPC ........... 438/424; 438/221; 438/222; 438/296; 438/359; 438/360; 438/427; 257/510; 257/E21.546; 257/E21.549

(58) Field of Classification Search
CPC ................ H01L 21/76232; H01L 21/76229
USPC ......... 438/242, 700, 268–274, 221–224, 296, 438/359–361, 424–438, 761–763; 257/118, 257/244, 328–333, 466, 594, 257/E21.546–E21.55, 510–513
See application file for complete search history.

(56) References Cited

U.S. PATENT DOCUMENTS 5,387,538 A * 2/1995 Moslehi ................... 438/431
5,447,884 A 9/1995 Fahey et al.
(Continued)

FOREIGN PATENT DOCUMENTS

EP 0 690 493 A2 1/1996
WO WO 2005/027210 A1 3/2005

OTHER PUBLICATIONS

"5.6. Atomic Layer Deposition," Chapter 5, Sections 205.6-205.11, downloaded Nov. 16, 2005, 18 pp., http://depts.washington.edu/solgel/ documents/class_docs/MSE502/Ch_5_Section_%205.6-2.11.pdf, University of Washington Materials Science and Engineering, Seattle, WA.

(Continued)

*Primary Examiner* — Laura Menz
*Assistant Examiner* — Maliheh Malek
(74) *Attorney, Agent, or Firm* — Slater & Matsil, L.L.P.

(57) ABSTRACT

Methods of fabricating isolation regions of semiconductor devices and structures thereof are disclosed. In a preferred embodiment, a semiconductor device includes a workpiece and at least one trench formed in the workpiece. The at least one trench includes sidewalls, a bottom surface, a lower portion, and an upper portion. A first liner is disposed over the sidewalls and the bottom surface of the at least one trench. A second liner is disposed over the first liner in the lower portion of the at least one trench. A first insulating material is disposed over the second liner in the lower portion of the at least one trench. A second insulating material is disposed over the first insulating material in the upper portion of the at least one trench. The first liner, the second liner, the first insulating material, and the second insulating material comprise an isolation region of the semiconductor device.

30 Claims, 8 Drawing Sheets

(56) References Cited

U.S. PATENT DOCUMENTS

| | | | |
|---|---|---|---|
| 5,492,858 A | 2/1996 | Bose et al. | |
| 5,691,232 A * | 11/1997 | Bashir et al. | 438/424 |
| 5,903,040 A * | 5/1999 | Hong | 257/510 |
| 5,989,978 A | 11/1999 | Peidous | |
| 6,037,237 A * | 3/2000 | Park et al. | 438/424 |
| 6,046,487 A | 4/2000 | Benedict et al. | |
| 6,127,241 A * | 10/2000 | Rha | 438/437 |
| 6,187,651 B1 * | 2/2001 | Oh | 438/435 |
| 6,251,735 B1 | 6/2001 | Lou | |
| 6,251,748 B1 | 6/2001 | Tsai | |
| 6,277,706 B1 | 8/2001 | Ishikawa | |
| 6,309,324 B1 * | 10/2001 | Sawa et al. | 477/125 |
| 6,309,924 B1 * | 10/2001 | Divakaruni et al. | 438/243 |
| 6,313,008 B1 * | 11/2001 | Leung et al. | 438/424 |
| 6,406,975 B1 * | 6/2002 | Lim et al. | 438/421 |
| 6,534,395 B2 | 3/2003 | Werkhoven et al. | |
| 6,589,853 B2 | 7/2003 | Kumamoto | |
| 6,593,207 B2 * | 7/2003 | Hong et al. | 438/424 |
| 6,620,703 B2 * | 9/2003 | Kunikiyo | 438/422 |
| 6,683,354 B2 * | 1/2004 | Heo et al. | 257/397 |
| 6,720,259 B2 | 4/2004 | Londergan et al. | |
| 6,740,592 B1 | 5/2004 | Doong | |
| 6,740,955 B1 * | 5/2004 | Hong et al. | 257/506 |
| 6,750,117 B1 * | 6/2004 | Hung et al. | 438/437 |
| 6,884,677 B2 | 4/2005 | Kim | |
| 7,118,987 B2 * | 10/2006 | Fu et al. | 438/435 |
| 7,163,860 B1 | 1/2007 | Kamal et al. | |
| 7,229,896 B2 | 6/2007 | Chen et al. | |
| 7,327,009 B2 | 2/2008 | Chen et al. | |
| 7,351,661 B2 * | 4/2008 | Heo et al. | 438/689 |
| 7,759,215 B2 * | 7/2010 | Ohta | 438/424 |
| 8,501,632 B2 * | 8/2013 | Stapelmann et al. | 438/758 |
| 2001/0009809 A1 * | 7/2001 | Miwa | 438/689 |
| 2002/0004282 A1 | 1/2002 | Hong | |
| 2002/0031890 A1 | 3/2002 | Watanabe et al. | |
| 2002/0072198 A1 * | 6/2002 | Ahn | 438/424 |
| 2002/0100953 A1 | 8/2002 | Park | |
| 2002/0117731 A1 * | 8/2002 | Kim et al. | 257/510 |
| 2002/0127817 A1 * | 9/2002 | Heo et al. | 438/424 |
| 2002/0127818 A1 | 9/2002 | Lee et al. | |
| 2002/0197823 A1 | 12/2002 | Yoo et al. | |
| 2004/0023516 A1 | 2/2004 | Londergan et al. | |
| 2004/0029353 A1 | 2/2004 | Zheng et al. | |
| 2004/0058507 A1 | 3/2004 | Ho et al. | |
| 2004/0082144 A1 | 4/2004 | Park et al. | |
| 2004/0106256 A1 | 6/2004 | Dong et al. | |
| 2004/0115897 A1 | 6/2004 | Inoue et al. | |
| 2004/0175919 A1 | 9/2004 | Ha et al. | |
| 2004/0198019 A1 | 10/2004 | Yasui et al. | |
| 2004/0209479 A1 * | 10/2004 | Heo et al. | 438/720 |
| 2004/0266176 A1 * | 12/2004 | Tanaka et al. | 438/637 |
| 2005/0020091 A1 | 1/2005 | Fucsko et al. | |
| 2005/0079682 A1 | 4/2005 | Lee et al. | |
| 2005/0136618 A1 | 6/2005 | Lee et al. | |
| 2005/0167778 A1 * | 8/2005 | Kim et al. | 257/510 |
| 2005/0170606 A1 | 8/2005 | Fu et al. | |
| 2005/0287731 A1 * | 12/2005 | Bian et al. | 438/201 |
| 2006/0043521 A1 | 3/2006 | Trivedi et al. | |
| 2006/0071274 A1 | 4/2006 | Cheng et al. | |
| 2006/0089008 A1 | 4/2006 | Hong et al. | |
| 2006/0105526 A1 * | 5/2006 | Kwon et al. | 438/268 |
| 2006/0216950 A1 | 9/2006 | Matsuura | |
| 2006/0220144 A1 | 10/2006 | Anezaki et al. | |
| 2006/0286819 A1 | 12/2006 | Seutter et al. | |
| 2007/0032039 A1 | 2/2007 | Chen et al. | |
| 2007/0141852 A1 * | 6/2007 | Stapelmann et al. | 438/758 |
| 2007/0210305 A1 * | 9/2007 | Kim et al. | 257/43 |
| 2007/0232021 A1 * | 10/2007 | Eun | 438/424 |
| 2008/0138958 A1 * | 6/2008 | Lee | 438/426 |

OTHER PUBLICATIONS

Hausmann D. et al., "Rapid Vapor Deposition of Highly Conformal Silica Nanolaminates," Science Magazine, Oct. 11, 2002, Abstract, http://www.sciencemag.org/cgi/ content/abstract/298/5592/402, American Association for the Advancement of Science, Washington, DC.

Lucovsky, G., "Ultrathin Nitrided Gate Dielectrics: Plasma Processing, Chemical Characterization, Performance, and Reliability," IBM Journal of Research and Development, 1999, 24 pp., http://www.research.ibm.com/journal/rd/433/lucovsky.txt, IBM, Yorktown Heights, NY.

Cotler, T.J., "High Quality Plasma-Enhanced Chemical Vapor Deposited Silicon Nitride Films," J. Electrochem. Soc., Jul. 1993, pp. 2071-2075, vol. 140, No. 7. The Electrochemical Society, Inc.

* cited by examiner

METHODS OF FABRICATING ISOLATION REGIONS OF SEMICONDUCTOR DEVICES AND STRUCTURES THEREOF

TECHNICAL FIELD

The present invention relates generally to the fabrication of semiconductor devices, and more particularly to the fabrication of isolation regions of semiconductor devices and structures thereof.

BACKGROUND

Semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor substrate or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip.

Isolation regions are used to provide electrical isolation between active areas or electronic components formed on an integrated circuit. Shallow trench isolation (STI) and deep trench (DT) isolation are examples of some types of isolation regions that are widely used in semiconductor devices, although there are other types of isolation regions that may be formed.

STI regions are often used in complementary metal oxide semiconductor (CMOS) devices, which use both positive and negative channel devices in complementary configurations. The positive and negative channel devices of CMOS devices are typically referred to as p channel metal oxide semiconductor (PMOS) and n channel metal oxide semiconductor (NMOS) transistors. The PMOS transistor is formed in an n well (e.g., a well implanted with n type dopants) and the NMOS transistor is formed in a p well. An STI region is formed between the n well and p well of the PMOS transistor and the NMOS transistor, respectively. The STI region usually extends within a semiconductor substrate by about the depth of the maximum n well and p well doping concentration, e.g., by about 0.2 to 1.0 μm, for example.

To form isolation regions, trenches are usually formed in a substrate, and the trenches are filled with insulating materials. Etch processes and chemical mechanical polishing (CMP) processes are used to remove excess insulating material from the top surface of the substrate.

One problem that often occurs in the formation of isolation regions is the formation of recesses or divots in the insulating material used to fill the trenches. The lack of insulating material in the recessed or divoted areas can result in inadequate electrical isolation between active areas and undesired topography being formed on the top surface of the substrate.

Another problem that can occur is difficulty in filling trenches having a high aspect ratio, wherein the depth is greater than the width.

Thus, what are needed in the art are improved methods of forming isolation regions and structures thereof.

SUMMARY OF THE INVENTION

These and other problems are generally solved or circumvented, and technical advantages are generally achieved, by preferred embodiments of the present invention, which provide novel methods of forming isolation regions of semiconductor devices and structures thereof.

In accordance with a preferred embodiment of the present invention, a semiconductor device includes a workpiece and at least one trench formed in the workpiece. The at least one trench includes sidewalls, a bottom surface, a lower portion, and an upper portion. A first liner is disposed over the sidewalls and the bottom surface of the at least one trench. A second liner is disposed over the first liner in the lower portion of the at least one trench. A first insulating material is disposed over the second liner in the lower portion of the at least one trench. A second insulating material is disposed over the first insulating material in the upper portion of the at least one trench. The first liner, the second liner, the first insulating material, and the second insulating material comprise an isolation region of the semiconductor device.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely in the formation of shallow trench isolation (STI) regions of semiconductor devices. The invention may also be applied, however, to the formation of other types of isolation structures, such as deep trench (DT) isolation, as an example.

Figure 1:
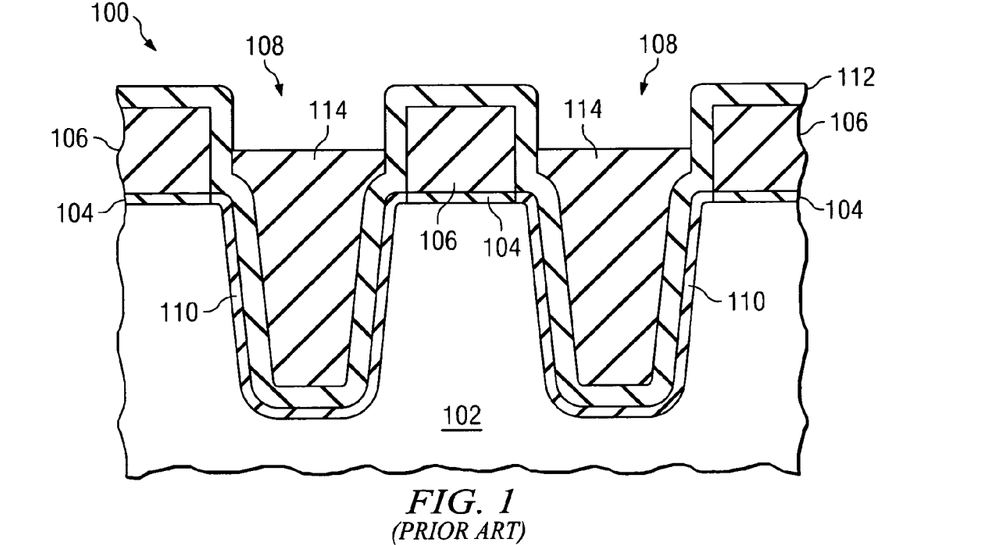
FIGS. 1 through 4 show cross-sectional views of a prior art method of forming isolation regions of a semiconductor device at various stages of manufacturing, wherein divots are formed over a nitride liner within the trench of the isolation regions.

With reference now to FIGS. 1 through 4, there is shown a prior art method of forming isolation regions of a semiconductor device 100 in a cross-sectional view at various stages of manufacturing. Referring first to FIG. 1, trenches 108 are formed in a substrate 102 having a pad oxide 104 and a pad nitride 106 formed thereon. An oxide liner 110 is formed over the sidewalls of the substrate 102, and a nitride liner 112 is formed over the oxide liner 110 and over the pad oxide 104 and pad nitride 106, as shown. The trenches 108 are then filled with an insulating material 114 comprising silicon dioxide.

Figure 2:
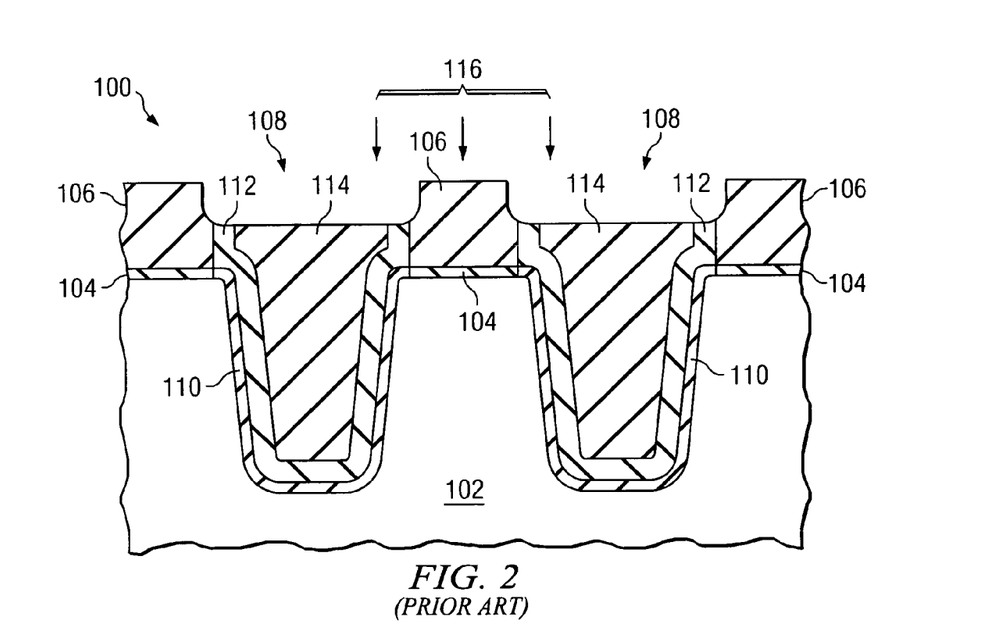

A phosphoric acid process 116 is used to remove the pad nitride 106 from over the substrate 102, as shown in FIG. 2. A CMP process may be used to facilitate the pad nitride removal and the removal of excess insulating material 114 from above the top surface of the substrate 102, as shown in FIG. 3.

Figure 3:
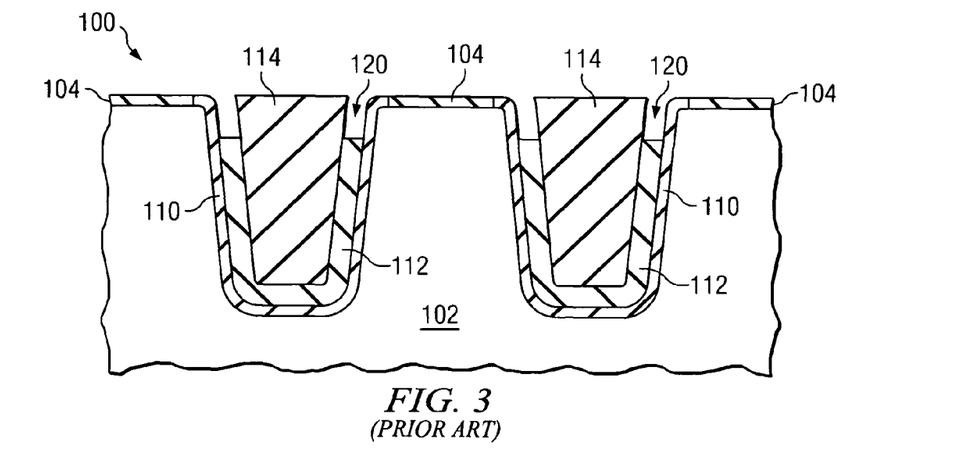
Figure 4:
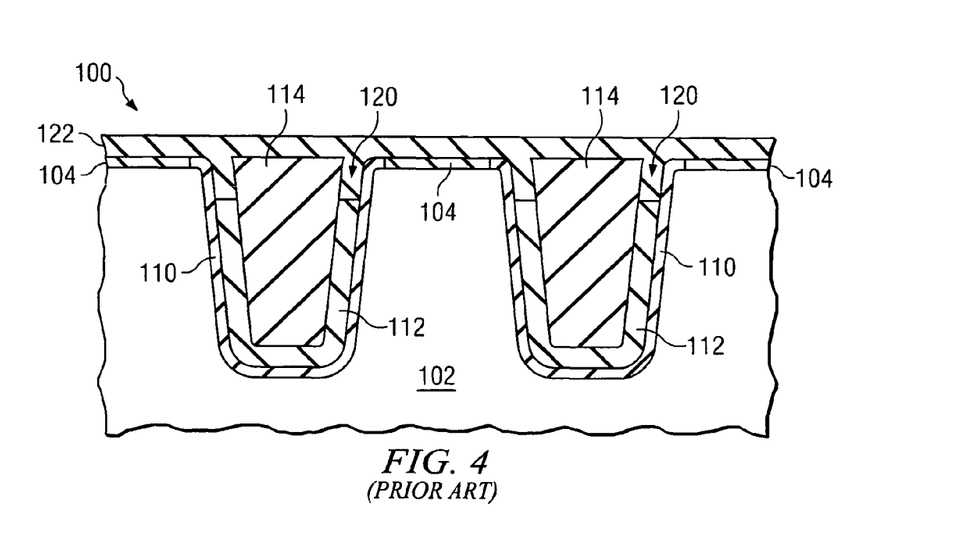

A problem with prior art isolation region formation is that divots 120 form during the removal of the pad nitride 106 and during the removal of the excess insulating material 114 from above the top surface of the substrate 102, as shown in FIG. 3. Divot 120 formation is problematic in that it results in poor electrical isolation of active areas within the substrate 102. Divot 120 formation also results in uneven and non-planar topography in the top surface of the substrate 102. The divots 120 increase the stress of the substrate 102, can cause shorts, and can cause degradation of the device at the corners near the divots 120. Thus, additional processing steps are required to refill the nitride liner 112 over the divots 120, as shown in FIG. 4.

For example, an additional nitride liner 122 may be deposited or back-filled to fill the divots 120, and then another polishing and/or removal process is used to remove the nitride liner 122, and in some applications, also the pad oxide 104 from over the top surface of the substrate 102. Problems that may occur with this approach towards divot 120 repair include poor adhesion of back-filled nitride liner 122: the back-filled nitride liner 122 may detach and break off, which has similar deleterious effects as the divots 120 described above.

Another problem that can occur in the formation isolation regions is that filling the trenches with insulating material can be difficult, particularly in high aspect ratio trenches, e.g., having an aspect ratio of about 5:1 or greater (where the trenches have a depth that is about 5 times greater than the width). If the aspect ratio is too high, then voids may form in the isolation regions, resulting in insufficient isolation between active areas, for example.

Figure 5:
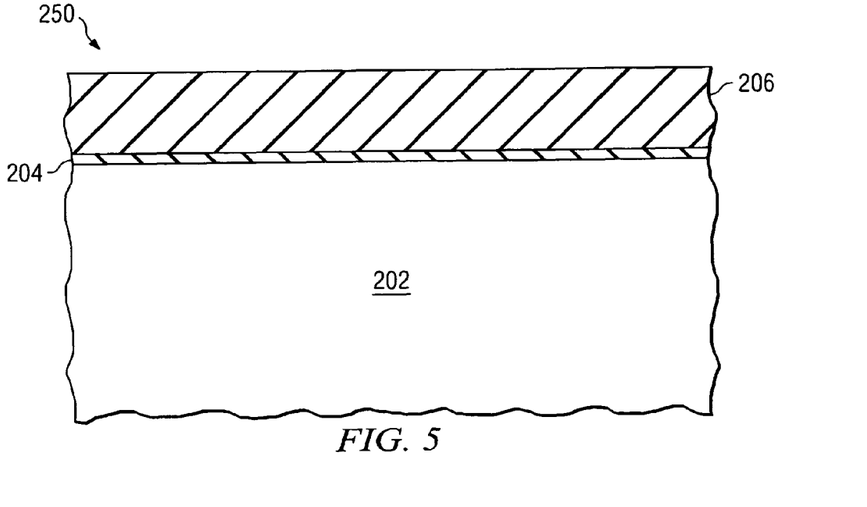
FIGS. 5 through 15 show cross-sectional views of a method of forming isolation regions of a semiconductor device at various stages of manufacturing in accordance with a preferred embodiment of the present invention.

Embodiments of the present invention achieve technical advantages by providing novel structures of and methods of forming isolation structures. FIGS. 5 through 15 show cross-sectional views of a method of forming isolation regions of a semiconductor device 250 at various stages of manufacturing. Referring next to FIG. 5, first, a workpiece 202 is provided. The workpiece 202 may include a semiconductor substrate comprising silicon or other semiconductor materials covered by an insulating layer, for example. The workpiece 202 may also include other active components or circuits, not shown. The workpiece 202 may comprise silicon oxide over single-crystal silicon, for example. The workpiece 202 may include other conductive layers or other semiconductor elements, e.g., transistors, diodes, capacitors, etc., not shown. Compound semiconductors, GaAs, InP, Si/Ge, or SiC, as examples, may be used in place of silicon. The workpiece 202 may also comprise bulk Si, SiGe, Ge, SiC, or a silicon-on-insulator (SOI) substrate, as examples.

A pad oxide 204 is formed over the workpiece 202. The pad oxide 204 may comprise about 4 to 10 nm of silicon dioxide ($SiO_2$), for example, although the pad oxide 204 may alternatively comprise other materials and dimensions. The pad oxide 204 is also referred to herein as a pad oxide layer, for example.

A pad nitride 206 is formed over the pad oxide 204. The pad nitride 206 may comprise about 100 nm of silicon nitride ($Si_xN_y$), for example, although the pad nitride 206 may alternatively comprise other materials and dimensions. The pad nitride 206 is also referred to herein as a pad nitride layer, for example. The pad nitride 206 and the pad oxide 204 are also referred to collectively herein as a sacrificial material layer 206/204, for example.

Figure 6:
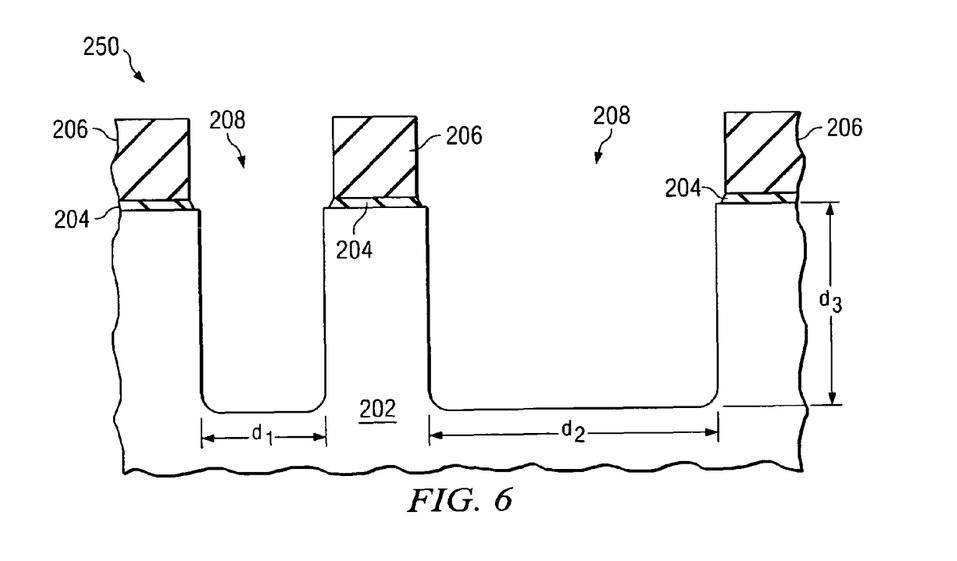

Trenches 208 for isolation regions are formed in the pad nitride 206, the pad oxide 204, and the workpiece 202, as shown in FIG. 6. The trenches 208 may be formed using lithography, by depositing a layer of photosensitive material (not shown) over the pad nitride 206, patterning the layer of photosensitive material using a lithography mask, and using the layer of photosensitive material as a mask while portions of the pad nitride 206, pad oxide 204, and the workpiece 202 are etched away, for example. The etch process to form the trenches 208 may comprise a dry etch or a reactive ion etch (RIE) process, as examples.

The trenches 208 may comprise a width of about 20 nm to several μm, for example, although the trench width may comprise other dimensions. The trenches 208 may vary in size across a workpiece 202, as shown. Some trenches 208 may comprise a width comprising about 50% greater than a minimum feature size (e.g., 1.5× the minimum feature size) of the semiconductor device 200, for example, as shown at $d_1$. The width $d_1$ may comprise about 50 nm for a 32 nm ground rule design, or about 100 nm for a 65 nm ground rule design, as examples. Other trenches 208 on the same workpiece 202 may comprise a width that is larger than 50% greater than the minimum feature size, as shown at $d_2$. The trenches 208 may comprise a depth $d_3$ from the top surface of the workpiece 202 of about 350 nm in some applications, although the depth $d_3$ may also comprise about 0.2 to 10 μm or greater, for example. The aspect ratio of the trenches 208 may be about 1:1 or less, as shown on the right in FIG. 6, about 5:1 or less, as shown on the left in FIG. 6, or about 5:1 or greater, as examples, depending on the application.

Figure 7:
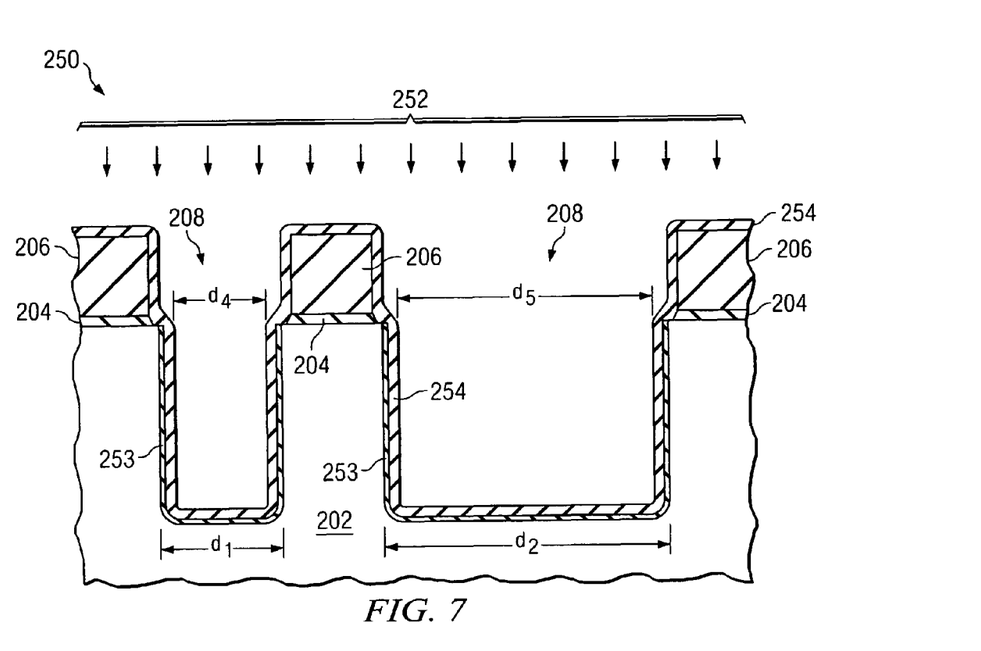
Figure 8:
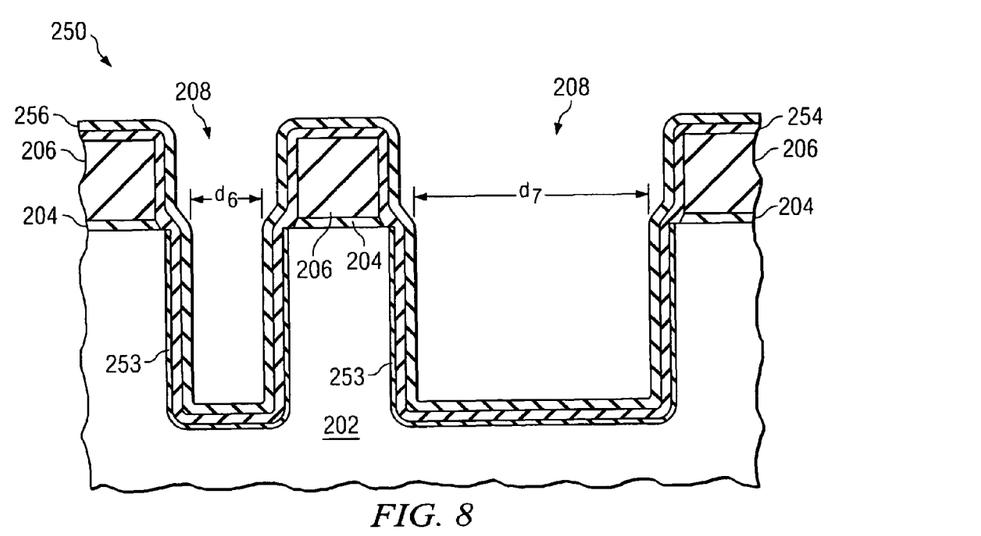

Next, a deposition process 252 is used to deposit a first liner 254 on the top surface of the pad nitride 206 and on the sidewalls and bottom surface of the trenches 208 formed within the pad nitride 206, the pad oxide 204, and the workpiece 202, as shown in FIG. 7. A second liner 256 is formed over the first liner 254, as shown in FIG. 8. An optional third liner 253 may be formed on the sidewalls and bottom surface of the trenches 208 before the deposition of the first liner 254, as shown.

The term "third" used herein with respect to the third liner 253 does not refer to the order of formation of the liners, because if included in the semiconductor device 250, the third liner 253 is actually the first liner formed in the manufacturing process flow. The term "third" is used herein for the third liner 253 to be consistent with terms used for the liners 253, 254, and 256 in other sections of the present patent application.

If the optional third liner 253 is included, after the formation of the trenches 208, the third liner 253 is formed. The third liner 253 preferably comprises an oxide liner formed by a thermal oxidation process in the presence of $O_2$, although other methods of oxidation may alternatively be used to form the third liner 253. The third liner 253 may comprise a thickness of about 5 nm or less, for example, although alternatively, the third liner 253 may comprise other dimensions.

The third liner 253 preferably comprises silicon dioxide ($SiO_2$), although alternatively, other oxides and insulating materials may also be used. Preferably, the third liner 253 is formed only on the sidewalls and bottom surface of the portion of the trenches 208 formed in the workpiece 202, as shown. The third liner 253 preferably is not formed on the pad oxide 204 or the pad nitride 206, for example. The optional third liner 253 is preferably formed by an oxidation process. In some preferred embodiments, a deposition process is preferably not used to form the optional third liner 253, for example. The third liner 253 preferably comprises an oxide material, and may comprise the same material as the pad oxide 204, in some embodiments.

The first liner 254 preferably comprises a layer of silicon dioxide having a thickness of about 10 nm or less, although alternatively, the first liner 254 may also comprise other insulating materials and dimensions. The first liner 254 preferably comprises tetra ethyl oxysilane (TEOS), in some embodiments, for example. The first liner 254 preferably comprises an oxide material, and may comprise the same material as the pad oxide 204, in some embodiments, and may also comprise the same material as the third liner 253, for example. The first liner 254 preferably comprises a different material than the pad nitride 206, in some embodiments. The first liner 254 is preferably substantially conformal and completely and evenly covers the top surfaces of the pad nitride 206 and the sidewalls of the trenches 208 formed in the pad nitride 206, the pad oxide 204, and the workpiece 202 (or the third liner 253, if present).

The deposition process 252 used to deposit the first liner 254 preferably comprises a sub-atmospheric chemical vapor deposition (SACVD) process or a high aspect ratio fill process, as examples, although other deposition processes 252 may also be used. The first liner 254 is preferably not formed using an oxidation process in some embodiments, for example, so that the first liner 254 is formed over the pad nitride 206 and the pad oxide 204 on top of the workpiece 202.

Figure 12:
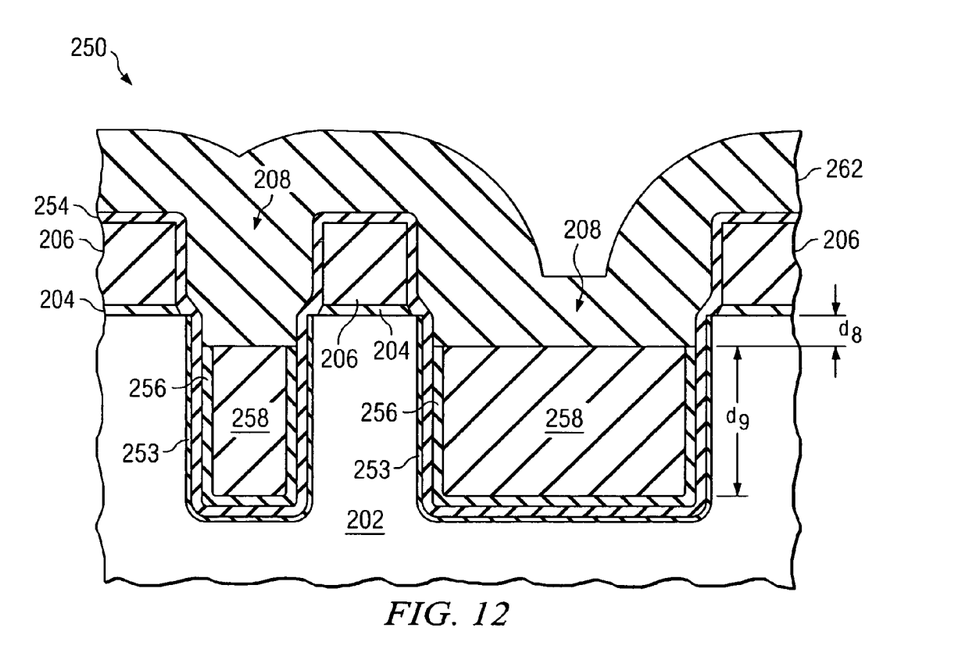

After the first liner 254 is deposited, preferably the remaining trench 208 minimum width $d_4$ and $d_5$ (see FIG. 7) comprises about 25 nm in some embodiments, to ensure that there is sufficient space within the trenches 208 to deposit an insulating fill material (e.g., such as the first insulating material 258 and the second insulating material 262 shown in FIG. 12, to be described further herein). The trench 208 width $d_4$ and $d_5$ preferably comprises about 25 nm or greater after the second liner 256 is deposited, for example.

The second liner 256 is then formed over the first liner 254, as shown in FIG. 8. The second liner 256 preferably comprises a layer of silicon nitride ($Si_xN_y$) having a thickness of about 4 nm or less, although alternatively, the second liner 256 may also comprise other insulating materials and dimensions. The second liner 256 preferably comprises a nitride material, and may comprise the same material as the pad nitride 206, in some embodiments. The second liner 256 is preferably formed using low pressure chemical vapor deposition (LPCVD), although other deposition processes may also be used. The second liner 256 is preferably substantially conformal and completely and evenly covers the first liner 254, as shown in FIG. 8.

After the second liner 256 is deposited, preferably the remaining trench 208 minimum width $d_6$ and $d_7$ comprises about 17 nm, to ensure that there is sufficient space within the trenches 208 to deposit an insulating fill material (such as first insulating material 258 and second insulating material 262 shown in FIG. 12). The trench 208 width $d_6$ and $d_7$ preferably comprises about 17 nm or greater after the second liner 256 is deposited, for example.

Figure 11:
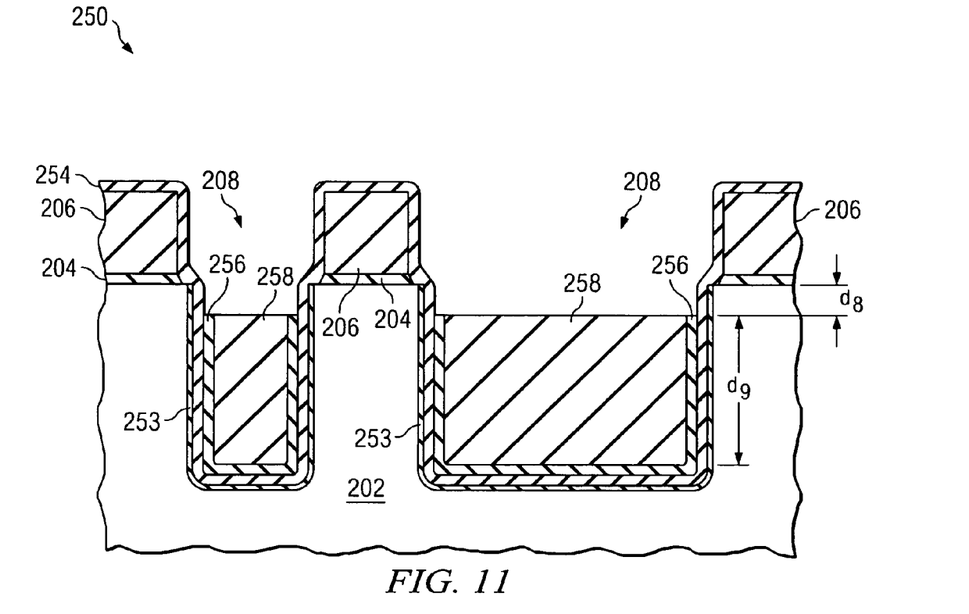

Next, a first insulating material 258 is deposited or formed over the trenches 208, e.g., over the second liner 256, to fill the trenches 208 to a height below the top surface of the workpiece 202. This may be accomplished by depositing the first insulating material 258 to partially fill the trench 208, in one embodiment, as shown in FIG. 11, e.g., using a spin-on process or other deposition process that results in a partial fill of the trenches 208.

Figure 9:
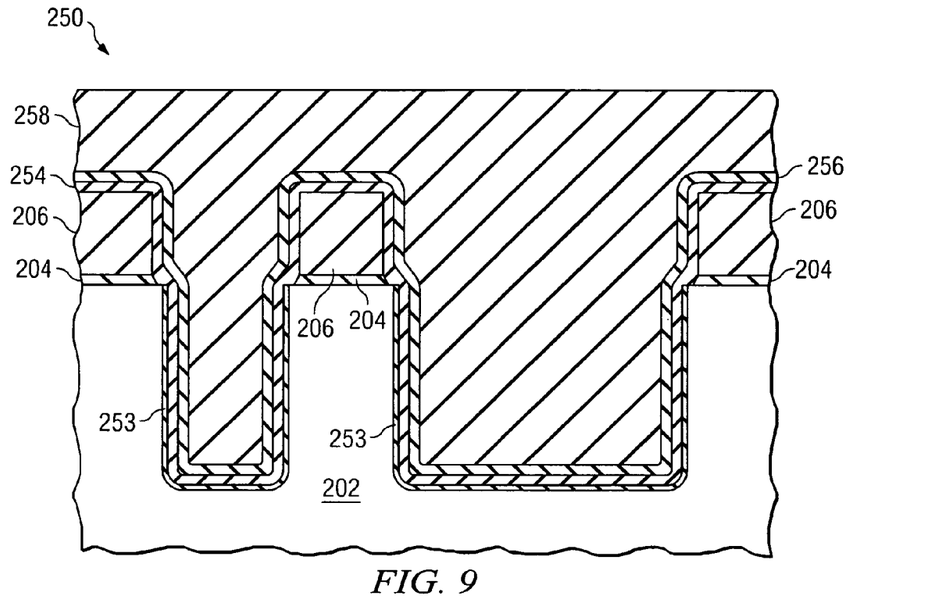

In another embodiment, the first insulating material 258 is formed by depositing the first insulating material 258 to a height above the top surface of the workpiece 202, as shown in FIG. 9. The first insulating material 258 is preferably deposited to a height above the top surface of the pad nitride 206, as shown, for example, in some embodiments.

The first insulating material 258 preferably comprises spin-on-glass (SOG) or FlowFill by Trikon, as examples, although alternatively, the first insulating material 258 may comprise other insulating materials. The first insulating material 258 preferably comprises an oxide material such as silicon dioxide, although alternatively, other insulating materials may be used for the first insulating material 258. The first insulating material 258 preferably comprises a material that may be etched selectively to silicon nitride, in some embodiments, for example. In some embodiments, the first insulating material 258 comprises a liquid when deposited, for example, and the first insulating material 258 may be allowed to dry for a period of time or heated to facilitate drying, for example.

Figure 10:
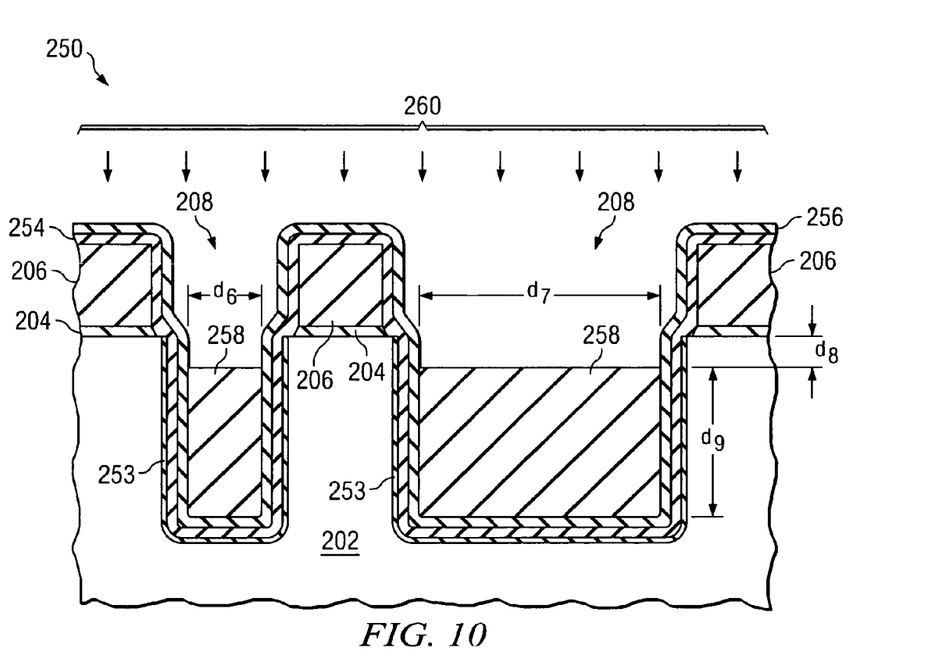

A top portion of the first insulating material 258 is then removed, recessing the first insulating material 258 below the top surface of the workpiece 202 by a depth or amount $d_8$ and leaving the first insulating material 258 within the lower portion of the trenches 208, as shown in FIG. 10. The depth $d_8$ below the top surface of the workpiece 202 may comprise about ½ or less of the total depth ($d_8+d_9$) of the first insulating material 258 within the trenches 208, for example, and more preferably, depth $d_8$ comprises about ¼ or less the total depth ($d_8+d_9$) that the first insulating material 258 extends into the trenches 208 in the workpiece 202, in some embodiments. The depth $d_8$ of the upper portion of the trench may comprise about 10 nm or greater, as an example.

The etch process 260 to remove the top portion of the first insulating material 258 may comprise a RIE etch process, as an example, although alternatively, other etch processes may also be used. The etch process 260 may comprise a RIE etchback using $C_4F_8$:CO 1:10, which has about a 10:1 selectivity to nitride materials, as an example. The first insulating material 258 is left remaining within the lower portion of the trenches 208, as shown at $d_9$.

After the top portion of the first insulating material 258 is removed, exposed portions of the second liner 256 are stripped or removed from the upper portion of the trenches 208, as shown in FIG. 11, leaving the second liner 256 disposed over the first liner 254 in the lower portion of the trenches 208.

A second insulating material 262 is deposited over the first insulating material 258 within the upper portion of the trenches 208 over the first liner 254, as shown in FIG. 12. The second insulating material 262 preferably comprises an oxide such as silicon dioxide, TEOS, or high density plasma (HDP) oxide, deposited by SACVD, a high aspect ratio fill process, or an HDP oxide deposition process, as examples, although other insulating materials and methods of deposition may also be used. The second insulating material 262 preferably comprises a different material than the first insulating material 258, in some embodiments, or the second insulating material 262 preferably is deposited using a different deposition method than used to form the first insulating material 258, in other embodiments.

In some embodiments, for example, the second insulating material 262 may comprise a material having a better texture and being an insulating material of better quality than the first insulating material 258, so that the second insulating material 262 has a more even and slow etch rate, which will advantageously result in a smoother topography in the top surface of the workpiece 202 after the isolation regions are formed. In some embodiments, for example, the first insulating material 258 may have a better fill quality yet may have a reduced quality of texture leading to an uneven and faster etch rate, so that after the etch process to remove the top portion of the first insulating material 258, the top surface of the first insulating material 258 may be rather uneven and rough. However, the second insulating material 262 is formed over the first insulating material 258 so that a topography or unevenness in the top surface of the first insulating material 258 does not present a problem.

Thus, in some embodiments of the present invention, the first insulating material 258 has better fill properties than the second insulating material 262, and the second insulating material 262 comprises a better quality and texture insulating material with an even and slower etch rate than the first insulating material 258, as examples.

Advantageously, because of the presence of the first insulating material 258 within the lower portion of the trenches 208, the remaining aspect ratio for the fill process of the second insulating material 262 is reduced, e.g., to less than about 3:1 in some embodiments, for example.

Figure 13:
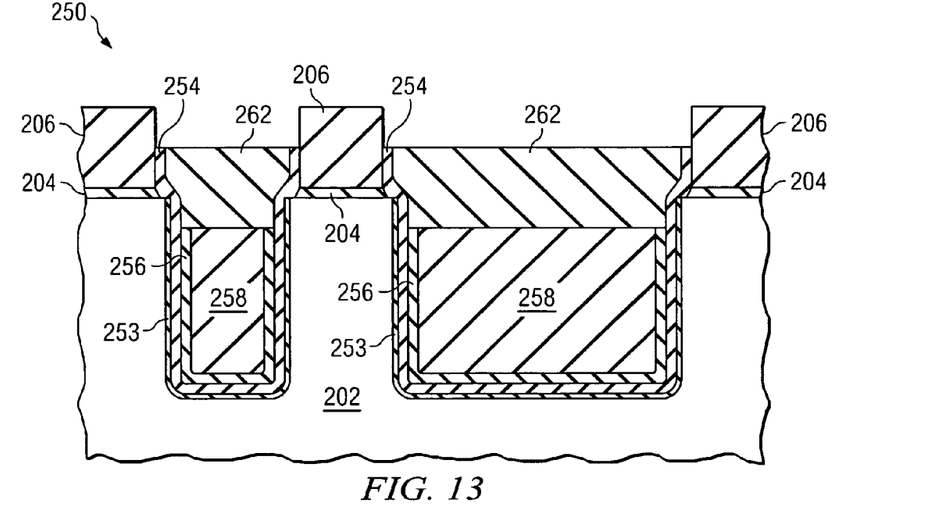

Next, excess portions of the second insulating material 262 are removed from above the pad nitride 206, as shown in FIG. 13. The excess portions of the second insulating material 262 may be removed by a combination of a CMP process and an etch process, for example. The CMP process preferably comprises a fixed abrasive CMP, and may comprise a slurry-less CMP process, as examples, because the topology of the top surface of the semiconductor device 250 is relatively smooth prior to the CMP process, and thus a pre-planarization CMP process may not be required, for example. After the CMP process, the second insulating material 262 may be substantially coplanar with the top surface of the pad nitride. Then, an etch process may be used to recess the second insulating material 262 slightly below the top surface of the pad nitride, as shown in FIG. 13. The etch process may comprise a wet etch process selective to a nitride material, for example.

Figure 14:
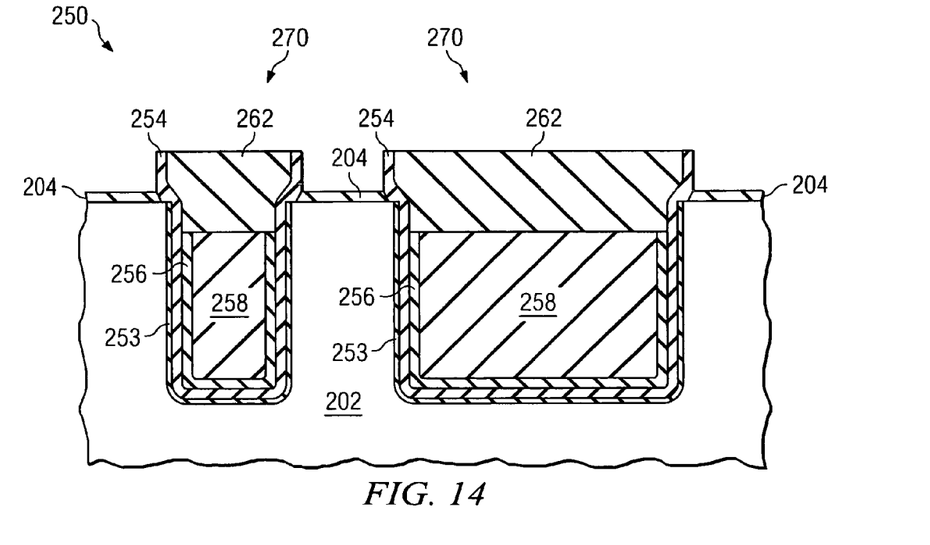

The pad nitride 206 is then removed, as shown in FIG. 14, e.g., using an etch process selective to an oxide material. One or more removal processes may be used to remove the pad nitride 206 from the top surface of the workpiece 202 and to remove at least a portion of the excess second insulating material 262 from above at least a portion of the top surface of the workpiece 202, leaving the structure shown in FIG. 15. For example, a first etch process comprising phosphoric acid may be used to remove the pad nitride 206. Optionally, a second etch process comprising hydrofluoric acid may then be used to remove at least a portion of the excess second insulating material 262 from over at least a portion of the top surface of the workpiece 202. Alternatively, the excess second insulating material 262 may be removed during the first etch process comprising phosphoric acid, for example. Different chemistries may also be used to remove oxide material and nitride material, for example. A chemical mechanical polishing (CMP) process may also be used to remove the excess second insulating material 262 and/or the pad nitride 206, for example.

In the etch processes to remove the pad nitride 206 and excess second insulating material 262, or in a separate etch process, the pad oxide 204 may also be removed, although alternatively, the pad oxide 204 may be left remaining in the structure, not shown. If the pad oxide 204 is left remaining in the structure, then the second insulating material 262 and the first liner 254 are preferably at least coplanar with the top surface of the workpiece 202; e.g., the second insulating material 262 and the first liner 254 may extend slightly above the top surface of the workpiece 202 by about the thickness of the pad oxide 204.

A small amount of the first liner 254 and the second insulating material 262 may be removed when the pad oxide 204 is removed, because the pad oxide 204, first liner 254, and second insulating material 262 preferably comprise oxide materials and thus etch when exposed to the same chemistries. However, preferably the first liner 254 and the second insulating material 262 extend above the workpiece 202 by an amount greater than the thickness of the pad oxide 204, as shown in FIG. 14, so that after the pad oxide 204 is removed, the first liner 254 and the second insulating material 262 have a height that is greater than the height of the workpiece 202 top surface, as shown in FIG. 15.

Figure 15:
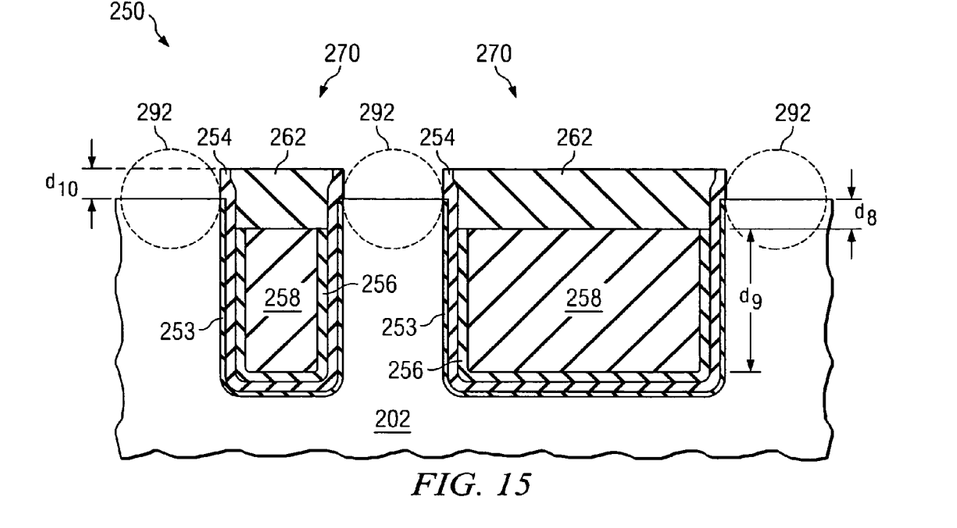

In some embodiments, preferably the excess material removal processes to remove the pad nitride 206, at least a portion of the second insulating material 262 over the trench 208, and optionally, the pad oxide 204, are designed to result in a positive step height $d_{10}$ above the workpiece 202, as shown in FIG. 15, wherein the top surface of the second insulating material 262 is greater than the top surface of the workpiece 202 by an amount $d_{10}$. The amount of the positive step height $d_{10}$ preferably comprises about 30 nm, and more preferably, comprises about 0 to 40 nm, above the top surface of the workpiece 202 above the trench 208 area, for example, although alternatively, the positive step height $d_{10}$ may comprise other dimensions.

The dimension $d_{10}$ may vary across a surface of a workpiece 202, by about 0 to 40 nm or more, due to variations in the etch processes, which may comprise dry or wet etch processes, as examples, used to remove excess insulating materials 262 and first liner 254 from the top surface of the workpiece 202, for example. In other embodiments, the dimension $d_{10}$ may be about the same for isolation structures 270 across the surface of a workpiece 202 and may comprise about 0 to 40 nm, for example. Preferably, however, in accordance with preferred embodiments of the present invention, a negative step height is not produced, e.g., preferably the top surfaces of the second insulating material 262 and the first liner 254 are not lower than the top surface of the workpiece 202, which would result in inadequate isolation of the isolation structures 270, in some applications. The goal of a positive step height $d_{10}$ is preferable in some embodiments, to ensure that a negative step height is not produced, for example.

The sidewalls of the portion of the second insulating material 262 and first liner 254 that extend above the top surface of the workpiece 202 may be tapered inwardly towards the second insulating material 262, not shown, due to the preceding recessing and etching steps described herein, for example.

The isolation structures 270 include the first liner 254, second liner 256, the first insulating material 258, the second insulating material 262, and the optional third liner 253, if included. Before or after the formation of the novel isolation structures 270 described herein, two or more active areas 292 may be formed in the workpiece 202, and a trench 208 may be formed between two of the active areas 292, for example, as shown in FIG. 15. The isolation structures 270 provide electrical isolation between the active areas 292. The active areas 292 may include transistors, complementary metal oxide semiconductor (CMOS) devices, memory devices, logic devices, power devices, circuitry components, groups of circuitry components, or combinations thereof, as examples, not shown. Alternatively, the active areas 292 may comprise other devices, for example. Conductive material layers and insulating material layers are then formed over the semiconductor device 250 (not shown), and the manufacturing process is continued to complete the fabrication of the semiconductor device 250.

Figure 16:
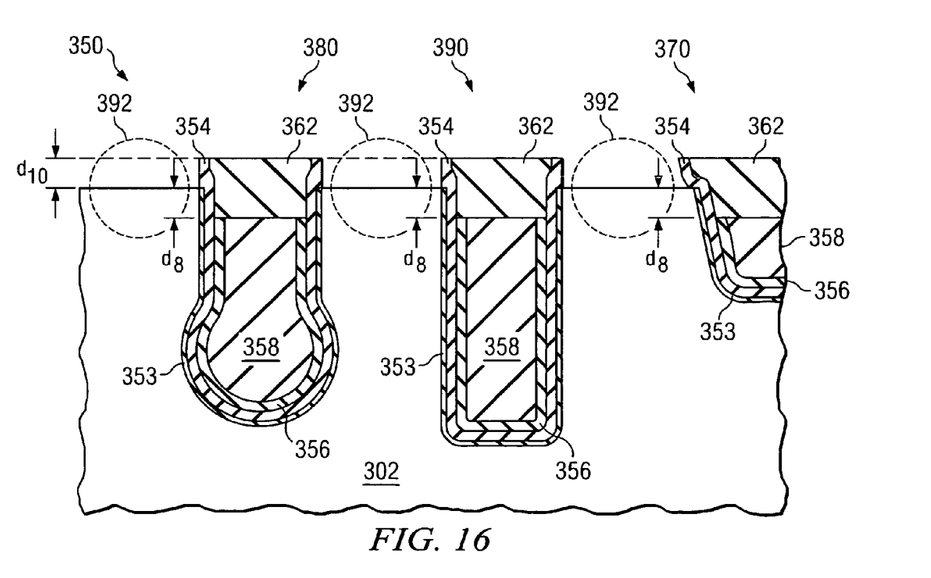
FIG. 16 shows a cross-sectional view of a semiconductor device, showing various shapes and types of isolation regions that may be formed using embodiments of the present invention.

The isolation structures 270 may comprise STI regions, DT isolation regions, combinations of STI and DT isolation regions, or other types of isolation structures, as examples. FIG. 16 shows several exemplary types of isolation regions and shapes of isolation regions that embodiments of the present invention may be implemented in, as examples. Like numerals are used in FIG. 16 for the various elements that were described in FIGS. 5 through 15. To avoid repetition, each reference number shown in FIG. 16 is not described again in detail herein. Rather, similar materials x02, x54, x56, etc. . . . are preferably used for the various material layers shown as were described for FIGS. 5 through 15, where x=2 in FIGS. 5 through 15, and x=3 in FIG. 16.

In FIG. 16, a portion of an STI region 370 formed in accordance with a preferred embodiment of the present invention is shown. A deep trench isolation region 390 is also shown that has a greater depth within the workpiece 302 than the STI region 370. A combination of a STI region 370 and a DT isolation region 390 (not shown) may also be formed using the embodiments of the present invention, by forming a trench 208 that is wider at the upper portion than at the lower portion, and filling the trench with the liners 253, 254, and 256, and insulating materials 258 and 262 as described with reference to FIGS. 5 through 15, for example.

A retrograde isolation region 380 is also shown, wherein the trench for the isolation region 380 comprises a greater width at the lower portion of the trench than at the upper portion of the trench. Embodiments of the present invention are beneficial in filling retrograde isolation regions 380, because the deposition process used to deposit the first insulating material 358 may be optimized to fill the lower part of the trench (e.g., by comprising a liquid or spin-on material), and then a different type of deposition process or material may be used when depositing the second insulating material 362 in the upper portion of the trench, for example. The wider lower portions of the trench may comprise a curved shape, as shown, or may comprise a trapezoidal shape, not shown, as examples. The trenches for the isolation regions of embodiments of the present invention may comprise substantially perpendicular sidewalls, sidewalls tapered inwardly towards the lower portion of the trench, sidewalls tapered outwardly towards the lower portion of the trench, curved sidewalls in at least the lower portion of the trench, a retrograde shape comprising a greater width at the lower portion than at the upper portion, or other shapes, as examples.

Advantages of embodiments of the invention include providing novel methods of forming isolation regions 270, 370, 380, and 390 and structures thereof, wherein divots are not formed proximate the top surface of the workpiece 202 and 302. Because the second liner 256 and 356 comprising a nitride material is recessed below the top surface of the workpiece 202 and 302 by an amount $d_8$, the second liner 256 and 356 comprising the nitride material is not present at the top surface of the workpiece 202 and 302 and thus is not exposed to the CMP and etch processes used to remove the pad nitride 206 and other excess material from the top surface of the workpiece 202 and 302, avoiding the possible formation of divots proximate the top surface of the workpiece 202 and 302. Any divots that may form during the removal of the second liner 256 from the upper portion of the trench are covered and encapsulated by the second insulating material 262. Thus, isolation structures 270, 370, 380, and 390 with improved isolation and improved reliability are formed. The isolation structures 270, 370, 380, and 390 have a reduced chance of the formation of shorts when conductive materials are subsequently deposited, because of the absence of divots in the insulating materials 234 and 262 proximate the top surface of the workpiece 202.

Furthermore, isolation regions 270, 370, 380, and 390 having a smooth topography or a positive step height, or combinations thereof, across the surface of a semiconductor workpiece 202 are formed in accordance with embodiments of the present invention.

In addition, no nitride liner refill processes (such as the one shown in prior art FIG. 4) are required by preferred embodiments of the present invention, advantageously reducing the number of manufacturing process steps required to manufacture the semiconductor device 250, and thus reducing costs. Because a nitride liner refill process is not required, the problems associated with nitride liner refill processes are avoided, such as the possibility of poor adhesion of the refilled liner and subsequent yield loss, and also reducing the possibility of contamination of the isolation regions 270, 370, 380, and 390.

Advantageously, retrograde trench shapes and trenches with high aspect ratios, e.g., 5:1 or greater, may be filled with insulating materials (e.g., liners 253, 254, and 256, and insulating materials 258 and 262) using the preferred methods of forming isolation structures 270, 370, 380, and 390 described herein, due to the excellent fill quality of the first insulating material 258, for example.

The first insulating material 258 in the lower portion of the trench may comprise a material with excellent fill properties, and the second insulating material 262 proximate the top surface of the isolation region may comprise an excellent quality oxide, so that the etch processes to remove excess portions of the second insulating material 262 from the top surface of the workpiece 202 are improved and result in a smoother topography. Because the first insulating material 258 resides in the lower portion of the trench, filling the upper portion of the trench with the second insulating material 262 is simplified and made easier.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, the method comprising:
    forming a pad oxide over a workpiece;
    forming a pad nitride over the pad oxide;
    forming at least one trench in the pad nitride, the pad oxide and the workpiece, the at least one trench comprising sidewalls, a bottom surface, a lower portion, and an upper portion;
    forming a first oxide liner over the sidewalls and the bottom surface of the at least one trench and not over a top surface of the pad nitride;
    forming a second oxide liner directly on the first oxide liner and over the top surface of the pad nitride, the second oxide liner formed with a different process than the first oxide liner;
    forming a nitride liner on a top surface of the second oxide liner;
    filling the lower portion of the at least one trench with a first insulating material;
    etching the nitride liner from the upper portion of the at least one trench after filling the lower portion of the at least one trench with the first insulating material;
    filling the upper portion of the at least one trench with a second insulating material, the second insulating material comprising a different material than the first insulating material or the second insulating material being deposited using a different deposition method than the first insulating material, wherein the second insulating material is in physical contact with the nitride liner and with an upper portion of the top surface of the second oxide liner, wherein the first oxide liner, the second oxide liner, the nitride liner, the first insulating material, and the second insulating material in the at least one trench form an isolation region of the semiconductor device; and
    removing the pad nitride, wherein the second oxide liner and the second insulating material extend above the workpiece by an amount greater than a thickness of the pad oxide.

2. The method according to claim 1, wherein filling the lower portion of the at least one trench with the first insulating material comprises:
    depositing the first insulating material over the top surface of the pad nitride and entirely filling the at least one trench; and
    removing the first insulating material from the upper portion of the at least one trench.

3. The method according to claim 1, wherein sidewalls of a portion of the second oxide liner and the second insulating material that extends above the workpiece are tapered inwardly toward the second insulating material.

4. The method according to claim 1, wherein the the second oxide liner and the second insulating material extend above the workpiece by about 30 nm.

5. A method of forming an isolation region of a semiconductor device, the method comprising:
    forming a pad oxide over a workpiece;
    forming a pad nitride over the pad oxide;
    forming at least one trench in the pad nitride, the pad oxide, and the workpiece, the at least one trench having a lower portion and an upper portion, the at least one trench having sidewalls and a bottom surface;
    depositing a first oxide liner over the sidewalls and on the bottom surface;
    depositing a second oxide liner directly on a top surface of the first oxide liner, the second oxide liner disposed on top surfaces and sidewalls of the pad nitride;
    depositing a nitride liner on a top surface of the second oxide liner;
    forming a first insulating material in the lower portion of the at least one trench, the first insulating material disposed on the nitride liner;
    forming a second insulating material in the upper portion of the at least one trench, the second insulating material physically contacting the nitride liner and the second oxide liner, wherein the first oxide liner, the second oxide liner, the nitride liner, the first insulating material, and the second insulating material form the isolation region of the semiconductor device; and
    removing the pad nitride, wherein the second oxide liner and the second insulating material extend above the workpiece by an amount greater than a thickness of the pad oxide.

6. The method according to claim 5, wherein before forming the second insulating material in the upper portion of the at least one trench, etching the nitride liner from the upper portion of the at least one trench.

7. The method according to claim 5, wherein depositing the nitride liner comprises depositing about 4 nm or less of silicon nitride.

8. The method according to claim 5, wherein depositing the first oxide liner comprises oxidizing the sidewalls and bottom surface of the at least one trench.

9. The method according to claim 8, wherein oxidizing the sidewalls and bottom surface of the at least one trench within the workpiece comprises forming about 5 nm or less of silicon dioxide.

10. The method according to claim 5, wherein depositing the second oxide liner comprises depositing about 10 nm or less of silicon dioxide or tetra ethyl oxysilane (TEOS).

11. The method according to claim 5, wherein forming the first insulating material comprises forming spin-on glass (SOG) or silicon dioxide.

12. The method according to claim 5, wherein forming the first insulating material comprises depositing a material comprising a liquid when deposited.

13. The method according to claim 5, wherein forming the second insulating material comprises forming silicon dioxide, tetra ethyl oxysilane (TEOS), or high density plasma (HDP) oxide.

14. A method of forming an isolation region of a semiconductor device, the method comprising:
    forming a pad oxide over a top surface of a workpiece;
    forming a pad nitride over the pad oxide;
    forming at least one trench in the pad nitride, pad oxide and the workpiece, the at least one trench comprising sidewalls, a bottom surface, a lower portion, and an upper portion, wherein a first oxide liner is disposed on the sidewalls of the trench in the workpiece;
    depositing a second oxide liner directly on the first oxide liner;

forming a nitride liner over the second oxide liner in the lower portion of the at least one trench;

filling the lower portion of the at least one trench with a first insulating material;

filling the upper portion of the at least one trench with a second insulating material, wherein the second insulating material is directly attached to the nitride liner and the second oxide liner;

removing the pad nitride from over the workpiece; and removing a portion of the second insulating material from over the top surface of the workpiece, wherein after removing the portion of the second insulating material from over the top surface of the workpiece, the second oxide liner and the second insulating material are at least coplanar with the top surface of the workpiece, and wherein the second oxide liner, the nitride liner, the first insulating material, and the second insulating material form the isolation region of the semiconductor device, wherein the second oxide liner and the second insulating material extend above the workpiece by an amount greater than a thickness of the pad oxide.

15. The method according to claim 14, further comprising forming at least two active areas in the workpiece, wherein forming the at least one trench comprises forming a trench between the at least two active areas, wherein the isolation region provides isolation between the at least two active areas.

16. The method according to claim 15, wherein forming the at least two active areas in the workpiece comprises forming transistors, complementary metal oxide semiconductor (CMOS) devices, memory devices, logic devices, power devices, circuitry components, groups of circuitry components, or combinations thereof.

17. The method according to claim 14, wherein the isolation region comprises a shallow trench isolation (STI) region, a deep trench (DT) isolation region, or a combination of an STI region and a DT isolation region.

18. The method according to claim 14, wherein the upper portion of the at least one trench extends below the top surface of the workpiece by about 10 nm or greater.

19. The method according to claim 14, wherein filling the upper portion of the at least one trench comprises filling about ¼ or less of a total depth of the at least one trench.

20. The method according to claim 14, wherein an aspect ratio of the at least one trench is at least 5:1 depth to width.

21. The method according to claim 14, wherein depositing the second oxide liner comprises depositing tetra ethyl oxysilane using a sub-atmospheric chemical vapor deposition.

22. The method according to claim 14, wherein forming the nitride liner comprises using low pressure chemical vapor deposition.

23. The method according to claim 1, wherein filling the upper portion of the at least one trench comprises filling about ¼ or less of a total depth of the at least one trench.

24. The method according to claim 1, wherein an aspect ratio of the at least one trench is at least 5:1 depth to width.

25. The method according to claim 1, wherein forming the second oxide liner comprises depositing tetra ethyl oxysilane using a sub-atmospheric chemical vapor deposition.

26. The method according to claim 1, wherein forming the nitride liner comprises using low pressure chemical vapor deposition.

27. The method according to claim 5, wherein forming the second insulating material in the upper portion of the at least one trench comprises filling about ¼ or less of a total depth of the at least one trench.

28. The method according to claim 5, wherein an aspect ratio of the at least one trench is at least 5:1 depth to width.

29. The method according to claim 5, wherein depositing the second oxide liner comprises depositing tetra ethyl oxysilane using a sub-atmospheric chemical vapor deposition.

30. The method according to claim 5, wherein depositing the nitride liner comprises using low pressure chemical vapor deposition.

* * * * *